(12) United States Patent
Kakehashi et al.

(10) Patent No.: US 9,468,104 B2
(45) Date of Patent: Oct. 11, 2016

(54) MODULE BOARD

(71) Applicant: FUJITSU COMPONENT LIMITED, Tokyo (JP)

(72) Inventors: Tatsuya Kakehashi, Tokyo (JP); Masakazu Muranaga, Tokyo (JP); Shinya Yamamoto, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 214 days.

(21) Appl. No.: 14/184,958

(22) Filed: Feb. 20, 2014

(65) Prior Publication Data

US 2014/0233191 A1 Aug. 21, 2014

(30) Foreign Application Priority Data

Feb. 21, 2013 (JP) ................................ 2013-032450

(51) Int. Cl.
*H05K 1/14* (2006.01)
*H05K 1/11* (2006.01)
*H01L 23/498* (2006.01)

(52) U.S. Cl.
CPC ......... *H05K 1/144* (2013.01); *H01L 23/49811* (2013.01); *H01L 23/49833* (2013.01); *H05K 1/111* (2013.01); *H05K 1/141* (2013.01); *H01L 2924/0002* (2013.01); *H05K 2201/10378* (2013.01); *Y02P 70/611* (2015.11)

(58) Field of Classification Search
None
See application file for complete search history.

(56) References Cited

U.S. PATENT DOCUMENTS

| | | | | |
|---|---|---|---|---|
| 5,808,878 A * | 9/1998 | Saito | ...................... | H01L 23/552 257/659 |
| 6,137,164 A * | 10/2000 | Yew | .................. | H01L 23/49816 257/686 |
| 6,407,906 B1 * | 6/2002 | Ahiko | ..................... | H01G 4/012 361/303 |
| 6,633,078 B2 * | 10/2003 | Hamaguchi | ............. | H01L 23/13 257/686 |
| 7,087,988 B2 * | 8/2006 | Hosomi | .............. | H01L 25/0657 257/686 |
| 7,314,378 B2 * | 1/2008 | Takizawa | ............. | H05K 3/3415 174/260 |
| 7,477,523 B2 * | 1/2009 | Tsuji | ..................... | H01L 21/561 174/262 |

(Continued)

FOREIGN PATENT DOCUMENTS

JP 2004-303944 10/2004

*Primary Examiner* — Courtney Smith
*Assistant Examiner* — Rachen E Morrison
(74) *Attorney, Agent, or Firm* — IPUSA, PLLC

(57) ABSTRACT

A module board includes a first board including a first surface and a second surface, a second board where its first surface faces the second surface of the first board, an external electrode formed on the exterior of the second board, and a joining member joining the external electrode and a terminal provided on the second surface of the first board. The external electrode includes a first surface part positioned on the first surface of the second board, a second surface part positioned on a second surface of the second board opposite to the first surface, and a connecting part connecting the first and second surface parts. The joining member includes a joining surface joining to the external electrode. The joining surface covers the first surface part and at least a portion of the connecting part that is closer to the first surface part than to the second surface part.

9 Claims, 6 Drawing Sheets

(56) References Cited

U.S. PATENT DOCUMENTS

| | | | |
|---|---|---|---|
| 8,351,185 B2* | 1/2013 | Ohtsuka | H01L 24/02 29/25.03 |
| 8,436,457 B2* | 5/2013 | Crisp | H01L 25/105 257/684 |
| 8,981,547 B2* | 3/2015 | Crisp | G11O 5/04 257/686 |
| 2001/0002066 A1* | 5/2001 | Mita | H01L 21/4853 257/693 |
| 2001/0002727 A1* | 6/2001 | Shiraishi | H01L 21/563 257/685 |
| 2001/0028104 A1* | 10/2001 | Fukatsu | H01L 25/0657 257/685 |
| 2002/0158324 A1* | 10/2002 | Hamaguchi | H01L 23/13 257/686 |
| 2002/0171142 A1* | 11/2002 | Kinsman | H01L 21/563 257/737 |
| 2004/0245012 A1* | 12/2004 | Wabiszczewicz | H05K 1/141 174/250 |
| 2005/0212107 A1* | 9/2005 | Kato | H01L 21/4832 257/678 |
| 2005/0224934 A1* | 10/2005 | Kato | H01L 23/3128 257/676 |
| 2006/0071749 A1* | 4/2006 | Aoki | H01F 17/045 336/83 |
| 2007/0241441 A1* | 10/2007 | Choi | H01L 25/0652 257/686 |
| 2007/0246818 A1* | 10/2007 | Ejima | H01L 21/563 257/693 |
| 2007/0278677 A1* | 12/2007 | Ejima | H01L 23/49866 257/738 |
| 2009/0213561 A1* | 8/2009 | Mi | H01L 23/645 361/782 |
| 2009/0250822 A1* | 10/2009 | Chen | H01L 23/5385 257/777 |
| 2010/0102428 A1* | 4/2010 | Lee | H01L 23/481 257/686 |
| 2012/0012369 A1* | 1/2012 | Kato | H01L 23/49822 174/254 |
| 2012/0020026 A1* | 1/2012 | Oganesian | H01L 23/5389 361/707 |
| 2012/0080219 A1* | 4/2012 | Takeuchi | H01L 21/4846 174/259 |
| 2012/0086111 A1* | 4/2012 | Iwamoto | H01L 21/561 257/666 |
| 2012/0108108 A1* | 5/2012 | Horikawa | H01R 12/716 439/626 |
| 2012/0313262 A1* | 12/2012 | Suzuki | H01L 23/49816 257/777 |
| 2013/0033836 A1* | 2/2013 | Hattori | H01G 4/30 361/768 |
| 2014/0262473 A1* | 9/2014 | Robinson | H05K 9/0032 174/372 |
| 2014/0346653 A1* | 11/2014 | Muramatsu | H01L 23/552 257/659 |
| 2015/0279820 A1* | 10/2015 | Usami | H01L 25/0657 257/737 |

\* cited by examiner

MODULE BOARD

CROSS-REFERENCE TO RELATED APPLICATION

The present application is based upon and claims the benefit of priority of Japanese Patent Application No. 2013-032450, filed on Feb. 21, 2013, the entire contents of which are incorporated herein by reference.

BACKGROUND OF THE INVENTION

1. Field of the Invention

The present invention relates to module boards.

2. Description of the Related Art

Module boards on which active elements, passive elements and integrated circuits are mounted are often required to increase mounting density by having components mounted on each side. That is, module boards are often required to be highly functional using a printed wiring board.

In general, in the case of adopting a structure where components are disposed on each side of a main board of the module board in order to increase the degree of integration of components mounted on the main board, it is difficult to directly and simply connect the main board to a motherboard of a surface-mounting type.

Therefore, the main board may be mounted on the motherboard by forming a recess for accommodating components mounted on one side of the main board in the motherboard or by using solder balls as terminals. Furthermore, as described in Japanese Laid-Open Patent Application No. 2004-303944, it has been proposed to electrically and mechanically connect the main board and the motherboard by providing a frame-shaped sub board between the main board and the motherboard to accommodate components on one side of the main board.

SUMMARY OF THE INVENTION

According to an aspect of the invention, a module board includes a first board including a first surface and a second surface, a second board where its first surface faces the second surface of the first board, an external electrode formed on the exterior of the second board, and a joining member joining the external electrode and a terminal provided on the second surface of the first board. The external electrode includes a first surface part positioned on the first surface of the second board, a second surface part positioned on a second surface of the second board opposite to the first surface, and a connecting part connecting the first and second surface parts. The joining member includes a joining surface joining to the external electrode. The joining surface covers the first surface part and at least a portion of the connecting part that is closer to the first surface part than to the second surface part.

BRIEF DESCRIPTION OF THE DRAWINGS

FIG. 5A and FIG. 53 are schematic perspective views illustrating a specific configuration of the sub board of the module board of the first embodiment;

DESCRIPTION OF THE EMBODIMENTS

Japanese Laid-Open Patent Application No. 2004-303944 does not describe a particular form of junction of the main board and the sub board. In general, the number and the volume of components mounted on the main board are on the increase, and a load on the junction increases because of the deflection of the main board due to an increase in its own weight. Therefore, a more robust form of junction of the main board and the sub board is desired.

Embodiments of the present invention are described below with reference to the accompanying drawings.

[First Embodiment]

Figure 1:
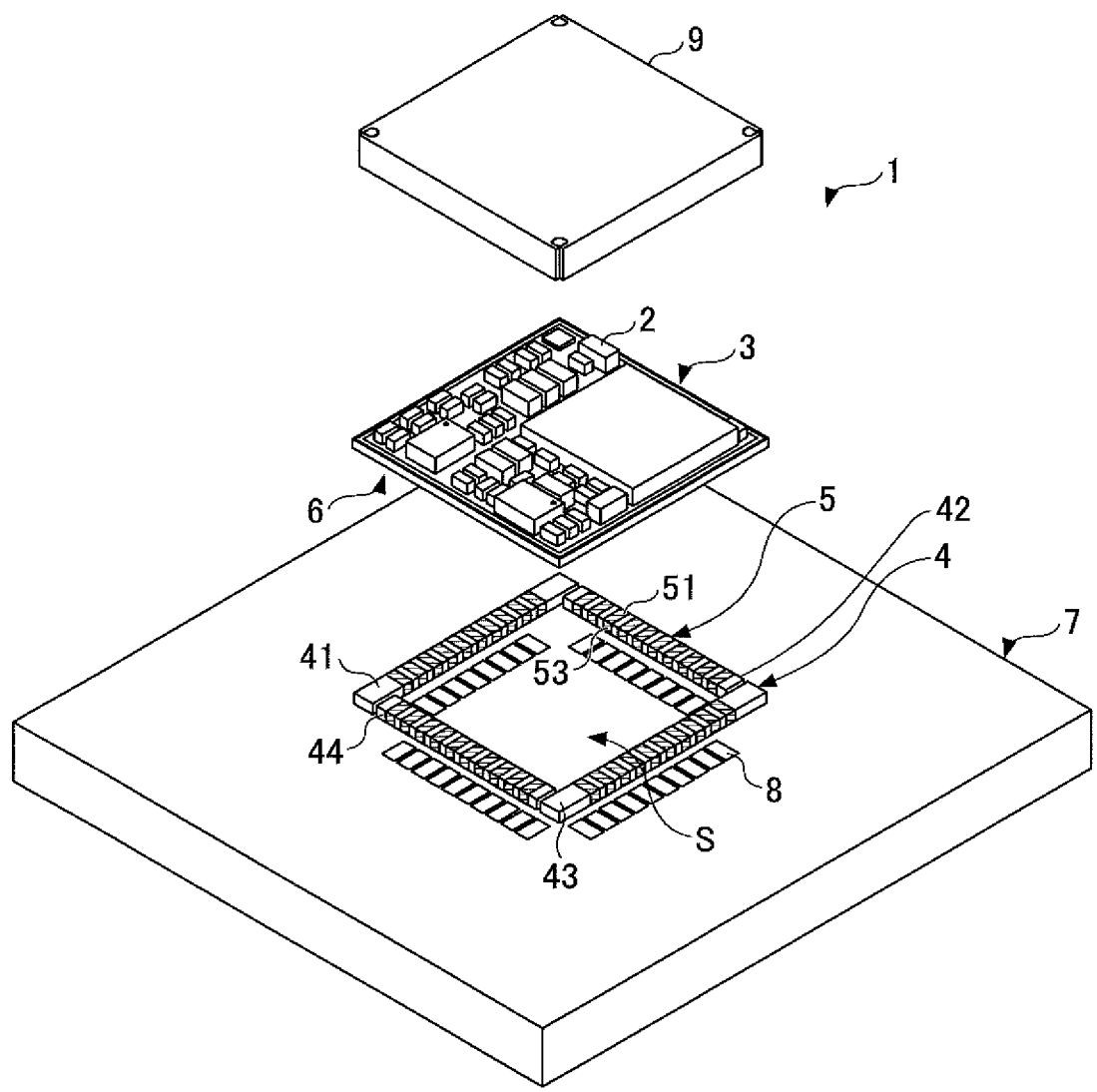
FIG. 1 is a top-side schematic perspective view of a configuration of a module board according to a first embodiment of the present invention.

Referring to FIG. 1, a module board 1 according to a first embodiment includes a main (first) board 3, a sub (second) board 4, external electrodes 5, and pads 6 (terminals). Electronic components 2 including an active element, a passive element, an IC and an LSI are mounted on both surfaces (first or top surface and second or bottom surface) of the main board 3. The sub board 4 is positioned on the second surface side, which is the lower side of the main board 3 in FIG. 1. The external electrodes 5 are formed on exterior surfaces of the sub board 4. The pads 6 are provided on the second surface of the main board 3 in an arrangement corresponding to the arrangement of the external electrodes 5. In FIG. 1, components are arranged in a direction perpendicular to the first and second surfaces of the main board 3, and solder layers described below are omitted from FIG. 1.

As illustrated in FIG. 1, the sub board 4 includes four sub board parts 41, 42, 43 and 44, which are combined to form a frame shape. Each of the sub board parts 41 through 44 corresponds to one of the four sides of the quadrilateral main board 3, respectively. Each of the sub board parts 41 through 44 has a laterally elongated rectangular cross section and extends in a direction in which the corresponding side of the main board 3 extends. An accommodating space S for accommodating the electronic components 2 disposed on the second surface of the main board 3 is formed inside the frame defined by the sub board parts 41 through 44. The external electrodes 5 are provided on the frame-shaped sub board 4 except for the four corners of the frame. The external electrodes 5 are arranged on each of the sub board parts 41 through 44 with a predetermined pitch in the lengthwise direction of each of the sub board parts 41 through 44.

Each of the external electrodes 5 includes a first surface part 51 positioned on a first surface of the sub board 4 which is an upper surface in FIG. 1, and a second surface part 52 (illustrated in FIGS. 2A, 2B and 2C) positioned on a second surface of the sub board 4. Furthermore, each of the external electrodes 5 includes first and second connecting parts 53 that connect the first surface part 51 and the second surface part 52. The first connecting part 53 is formed on an inner side surface of the sub board 4 which faces the accommodating space S. The second connecting part 53 is formed on an outer side surface of the sub board 4, which faces away from the accommodating space S.

Furthermore, as illustrated in FIG. 1, a motherboard 7 which is a target of connection of the main board 3 (a connection board) is provided on the second surface side of the sub board 4. Pads 8 (terminals) of the motherboard 7 are arranged at positions corresponding to the second surface parts 52 of the external electrodes 5 formed on the sub board 4. Furthermore, a shield cover 9 (a shield member) which is a shield body is disposed on the first surface side of the main board 3. The shield cover 9 is connected to a ground circuit of the motherboard 7 by parts such as interconnects, and shields the main board 3 from outside. The shield cover 9 is fixed to an outside edge of the main board 3 by fitting or bonding.

The module board 1 of the first embodiment is formed by joining the main board 3 and the sub board 4 illustrated in FIG. 1 by executing a reflow process after placing solder which forms a solder layer 10 (a joining member) illustrated in FIGS. 2A through 2C and FIG. 3 that connects the pads 6 and the external electrodes 5 on the first surface parts 51 of the external electrodes 5. Furthermore, the sub board 4 and the motherboard 7 are joined by executing a reflow process after placing solder which forms a solder layer 11 (an additional joining member) illustrated in FIGS. 2A through 2C that connects the external electrodes 5 and the pads 8, on the pads B.

Figure 2A:
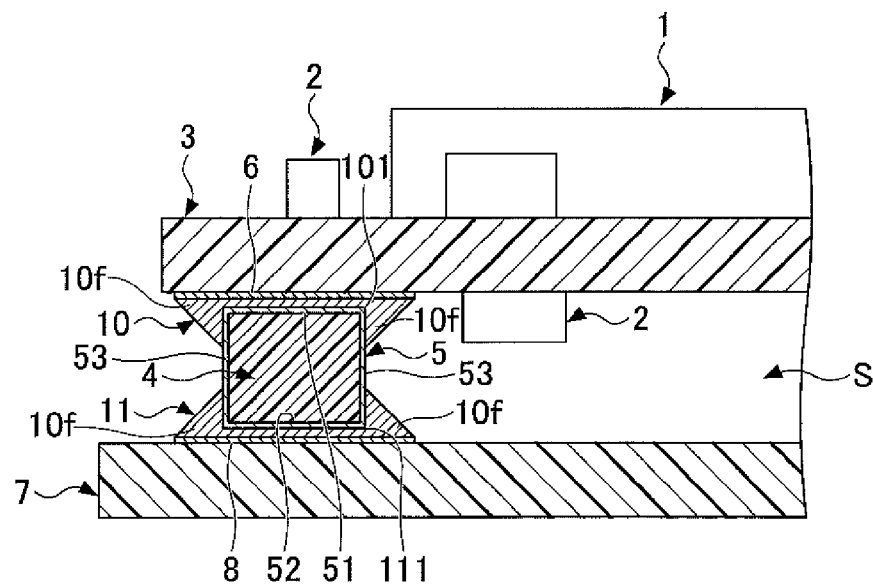
FIGS. 2A through 2C are schematic cross-sectional views illustrating, in a cross section of a sub board, forms of joining of a solder layer of a configuration of the module board of the first embodiment.
Figure 2B:
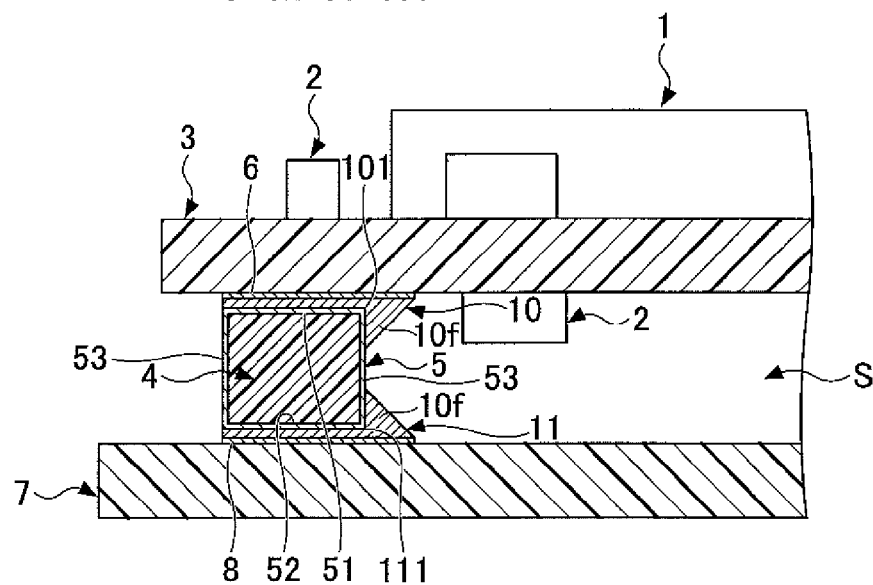
Figure 2C:
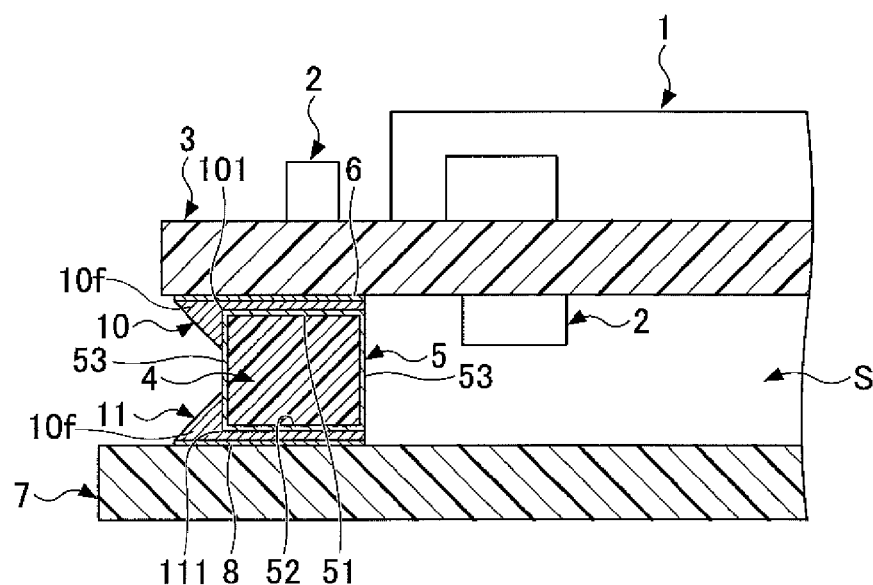

FIGS. 2A through 2C are partial cross-sectional views of the module board 1 and the motherboard 7 after the solder layer 10 and the solder layer 11 are formed and the module board 1 is mounted on the motherboard 7, taken along a plane perpendicular to a direction in which one of the sub board parts 41 through 44 extends. The connecting parts 53 of each of the external electrodes 5 are formed on both the interior side surface and the exterior side surface of the sub board 4. Therefore, as illustrated in FIG. 2A, each of the external electrodes 5 forms a rectangle defined by the first surface part 51 on the first surface side serving as a long side, the second surface part 52 on the second surface side serving as a long side, and the connecting parts 53 serving as a pair of short sides.

Figure 3:
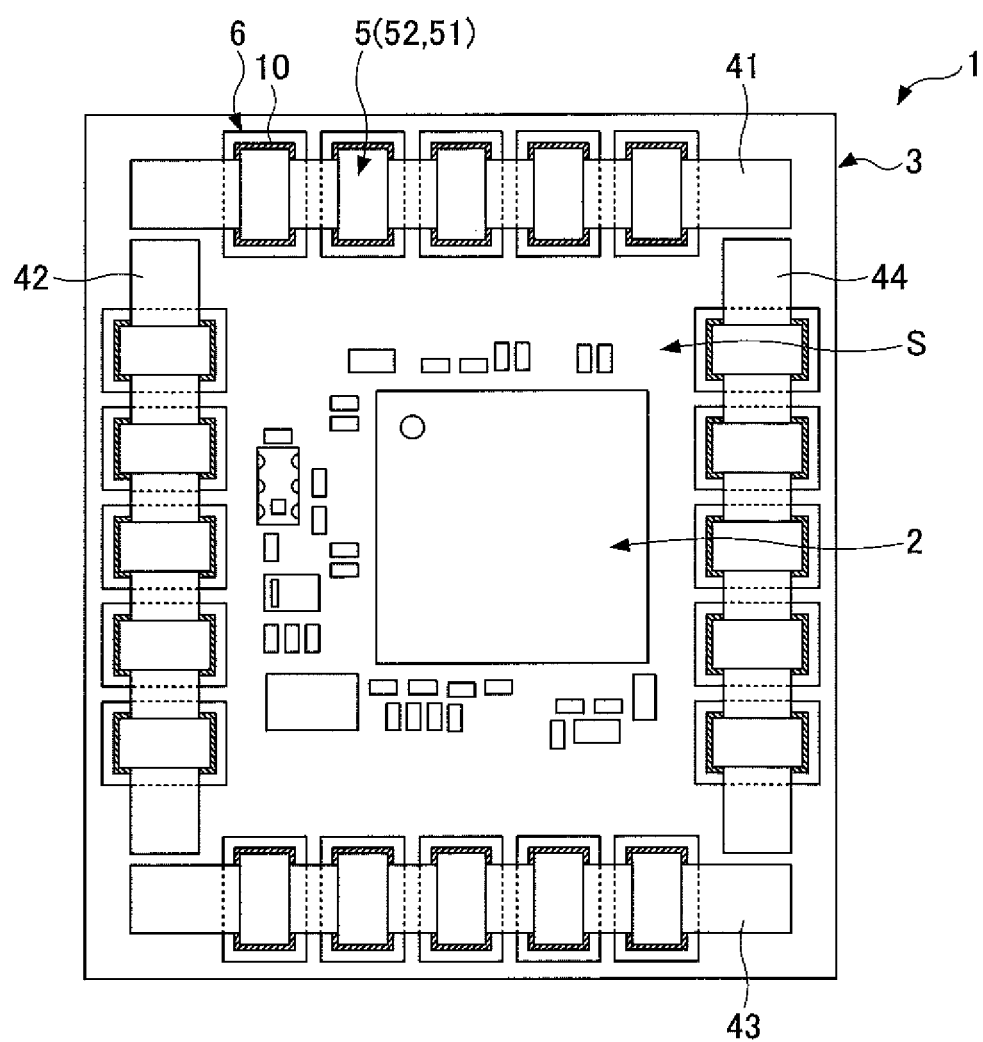
FIG. 3 is a schematic diagram illustrating a configuration of the module board of the first embodiment, viewed from the bottom side.

FIG. 3 illustrates a bottom side of the main board 3.

Referring to FIG. 2A and FIG. 3, the external shape of each of the pads 6 is greater than the external shape of the first surface part 51. The solder layer 10, which joins the pads 6 and the external electrodes 5, includes joining surfaces 101 that join to the corresponding external electrodes 5. Each of the joining surfaces 101 covers the first surface part 51 and a first end portion (a portion closer to the first surface part 51 than to the second surface part 52) of each of the connecting parts 53 of the corresponding external electrode 5.

Furthermore, the external shape of each of the pads 8 is greater than the external shape of the second surface part 52 of the corresponding external electrode 5. The solder layer 11 which joins the pads 8 and the external electrodes 5 includes joining surfaces 111 that join to the corresponding external electrodes 5. Each of the joining surfaces 111 covers the second surface part 52 and a second end portion (a portion closer to the second surface part 52 than to the first surface part 51) of each of the connecting parts 53 of the corresponding external electrode 5. In FIGS. 2A through 2C, the solder layer 10 and the solder layer 11 are illustrated on a larger scale than other components in order to depict the shapes of the solder layers 10 and 11 including the joining surfaces 101 and 111, respectively, in more detail.

The joining surface 101 of the solder layer 10 is formed into an inverted angular U-letter shape in the cross section perpendicular to a direction along a side of the sub board 4 illustrated in FIG. 2A, open in a direction away from the corresponding pad 6, by the first surface part 51 and the first end portion of each of the first connecting part 53 in the right and the second connecting part 53 in the left of the corresponding external electrode 5. In FIG. 2A, an oblique side connecting the lower left end of the joining surface 101 and the left end of the pad 6 and an oblique side connecting the lower right end of the joining surface 101 and the right end of the pad 6 define the exterior contour of the solder layer 10. That is, a fillet having a substantially triangular shape, defined by one of these oblique sides, an upper side that is a portion of the pad 6 projecting relative to the external electrode 5, and a vertical side that is one of the connecting parts 53, is formed on each side of the external electrode 5 in the solder layer 10.

Likewise, the joining surface 111 of the solder layer 11 is formed into an angular U-letter shape, open in a direction away from the corresponding pad 8, by the second surface part 52 and the second end portion of each of the first (right) and second (left) connecting parts 53 of the corresponding external electrode 5. In FIG. 2A, an oblique side connecting the upper left end of the joining surface 111 and the left end of the pad 8 and an oblique side connecting the upper right end of the joining surface 111 and the right end of the pad 8 define the exterior contour of the solder layer 11. That is, like in the solder layer 10, a fillet 10f having a substantially triangular shape is formed on each of the right side and the left side of the external electrode 5 in the solder layer 11. The size of these fillets 10f is controlled by determining the amount of solder forming the solder layers 10 and 11. That is, in the case of increasing the size of the fillets 10f, a larger amount of solder is used in a reflow process.

FIG. 3 is a bottom side view of the module board 1 after joining the sub board 4 to the main board 3 via the solder layer 10. In this bottom side view, because each of the pads 6 has an external shape greater than the external shape of the first surface part 51, the solder layer 10 forms substantially angular U-letter shapes defined by the corresponding pad 6 as an exterior contour and the corresponding first surface part 51 as an interior contour, on a region of the second surface parts 52 where the sub board parts 41 through 44 are absent.

According to the module board 1 of the first embodiment, in which the form of the solder layer 10 is determined as described above, it is possible to increase an area of each of the joining surfaces 101 by forming a pair of fillets positioned on both sides of each of the external electrodes 5, and it is possible to hold each of the external electrodes 5 from both sides by a pair of fillets included in the solder layer 10. Therefore, it is possible to increase the strength of the bonding of the solder layer 10 and the external electrodes 5.

Likewise, by determining the above-described form as the form of the solder layer 11, it is possible to increase the area of each of the joining surfaces 111 by forming a pair of fillets positioned on both sides of each of the external electrodes 5, and it is possible to hold each of the external electrodes 5 from both sides by a pair of fillets included in the solder layer 11 the same as in the case of the solder layer 10. Therefore, it is possible to increase the strength of the bonding of the solder layer 11 and the external electrodes 5.

Instead of forming the fillets 10f on both sides of each of the external electrodes 5 in the solder layers 10 and 11 as illustrated in FIG. 2A, it is possible to form the fillets 10f only on the accommodating space S side of each of the external electrodes 5 as illustrated in FIG. 2B, or to form the fillets 10f only on the side of each of the external electrodes 5 opposite to the accommodating space S side as illustrated in FIG. 2C. In these cases, the connecting parts 53 may be provided only on the side on which the fillets 10f are positioned. The configuration illustrated in FIG. 2B may be suitably applied in the case where the mounting density of components is high outside the sub board 4. The configuration illustrated in FIG. 2C may be suitably applied in the case where the mounting density of components inside the accommodating space S, that is, the mounting density of the electronic components 2 on the second surface of the main board 3, is high.

Figure 4A:
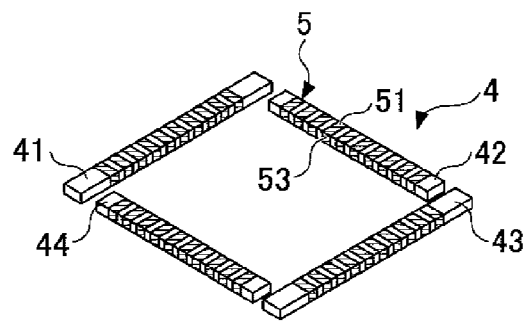
FIGS. 4A and 4B are schematic perspective views of the sub board of the module board of the first embodiment, illustrating specific configurations of the sub board.
Figure 4B:
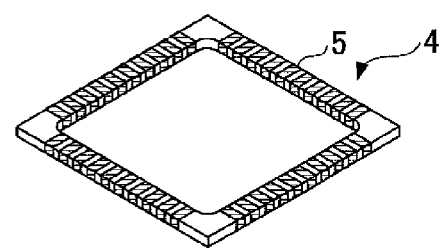
Figure 5A:
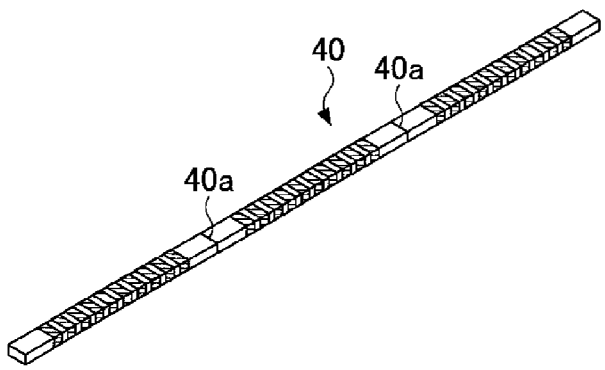
Figure 5B:
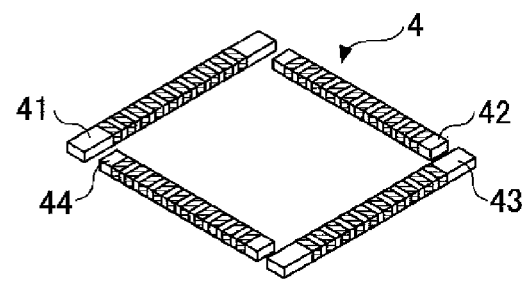

Furthermore, instead of forming the sub board 4 by combining the four sub board parts 41 through 44 as illustrated in FIG. 4A, the sub board 4 may be shaped as a frame in advance as illustrated in FIG. 4B. Furthermore, with respect to the configuration of the sub board 4 illustrated in FIG. 4A, a single bar-shaped sub board base material 40 may be formed in advance with, for example, notches 40a as illustrated in FIG. 5A, and the sub board parts 41 through 44 may be formed by cutting the sub board base material 40 at the notches 40a as illustrated in FIG. 5B

[Second Embodiment]

In the first embodiment, the shield cover 9 is fixed to an outside edge of the main board 3 by fitting or bonding, and is connected to a ground circuit of the motherboard 7 by interconnects. Alternatively, the shield cover 9 may be fixed to an outside edge of the main board 3 using the solder layer 10 and be electrically connected to a ground circuit of the motherboard 7 via the solder layer 10 and the sub board 4. A second embodiment directed to such a configuration is described below.

Figure 6:
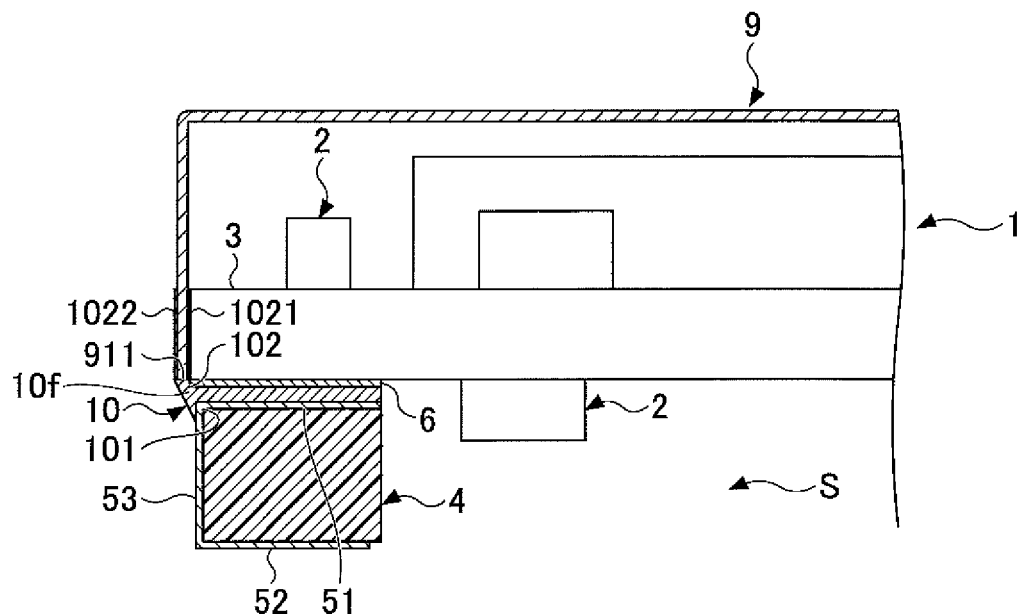
FIG. 6 is a schematic cross-sectional view illustrating a form of joining of a shield cover and a solder layer of the module board according to a second embodiment of the present invention.
Figure 7:
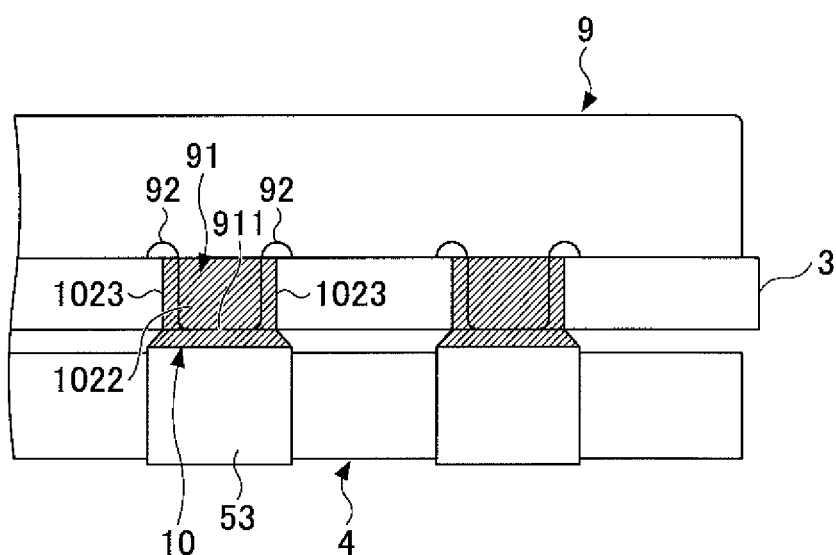
FIG. 7 is a schematic exterior side view of a form of joining of the shield cover and the solder layer of the module board according to the second embodiment.

As illustrated in FIG. 6, the solder layer 10 according to the second embodiment includes the fillets 10f only on the side of the external electrodes 5 opposite to the accommodating space S side, and the connecting parts 53 of the external electrodes 5 are provided only on the side of the external electrodes 5 opposite to the accommodating space S side. As illustrated in FIG. 7, the shield cover 9 includes multiple tongue pieces 91 protruding downward in correspondence to the external electrodes 5 of the sub board 4. A pair of punch holes 92 are formed at the base of each of the tongue pieces 91. A lower end 911 of each tongue piece 91 is at a position level with the position of the second surface of the main board 3 in a direction perpendicular to the second surface of the main board 3. That is, the lower ends 911 are positioned in the same plane as the second surface of the main board 3.

As illustrated in FIG. 6, the solder layer 10 includes joining surfaces 102 that join to the corresponding pads 6, and each of the joining surfaces 102 also covers the lower end 911 of the corresponding tongue piece 91. According to the second embodiment, solder melts and spreads because of solder wettability at the time of a reflow process, and enters a gap between the outside edge of the main board 3 and each tongue piece 91 to form a gap part 1021. The solder also melts and spreads onto an outside surface of each tongue piece 91 to form a side surface part 1022. Furthermore, as illustrated in FIG. 7, the solder is also caused to melt and spread to corner parts formed by both sides of each tongue piece 91 and the outside edge of the main board 3 to form a pair of tongue piece side parts 1023.

The external electrodes 5, to which the lower ends 911 of the tongue piece parts 91 of the shield cover 9 are connected, are connected to a built-in ground circuit (not illustrated) of the motherboard 7 via the corresponding pads 8 of the motherboard 7.

Like in the first embodiment, in the second embodiment as well, it is possible to increase the bondability of the pads 6 and the external electrodes 5 and to connect the shield cover 9 to a ground circuit of the motherboard 7 by electrically connecting the shield cover 9 to the external electrodes 5 by the solder layer 10 by joining the joining surfaces 102 to the lower ends 911 of the tongue piece parts 91 as well.

Figure 8:
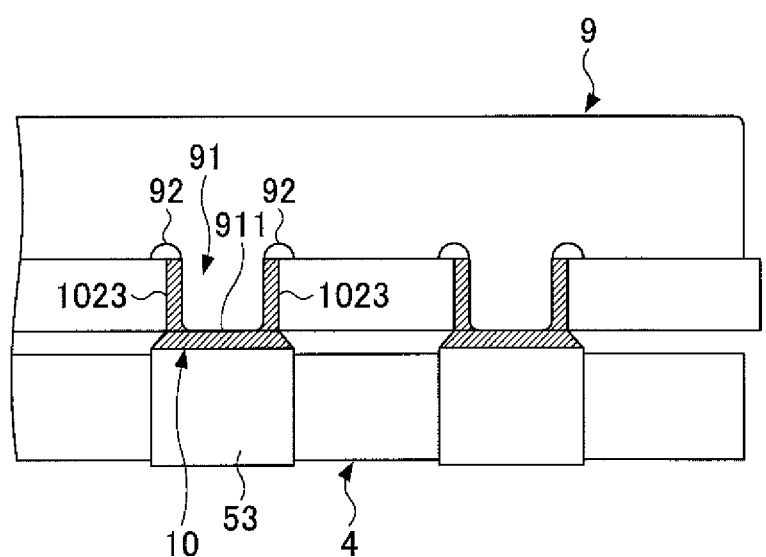
FIG. 8 is a schematic exterior side view of a form of joining of the shield cover and the solder layer of the module board according to the second embodiment.

Furthermore, by causing the solder layer 10 to form the gap parts 1021 and forming the tongue piece side parts 1023 and the side surface part 1022 as a unit to enclose each of the tongue piece part 91, it is possible to firmly join (bond) the tongue piece parts 91 to the main board 3. The side surface parts 1022 may be omitted as illustrated in FIG. 8. In the case of forming the side surface parts 1022, the amount of solder used in forming the solder layer 10 is greater than in the case of not forming the side surface parts 1022.

Embodiments of the present invention relate to module boards. It is possible to increase the bondability of the pads of the main board 3 and the external electrodes 5 of the sub board 4 by controlling the amount of solder for forming the solder layer 10. Therefore, embodiments of the present invention may be beneficially applied to electronic apparatuses where the main board 3, whose mounting density is desired to be high with respect to each of its sides, is mounted on the motherboard 7.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A module board, comprising:
   a first board including a first surface and a second surface on each of which an electronic component is mounted;
   a second board in which a first surface thereof faces the second surface of the first board;
   an external electrode formed on an exterior of the second board;
   a joining member that joins the external electrode and a first terminal provided on the second surface of the first board; and
   an additional joining member that joins the external electrode and a second terminal provided on a connection board to which the first board is to be connected,
   wherein
   the external electrode includes
      a first surface part positioned on the first surface of the second board;
      a second surface part positioned on a second surface of the second board opposite to the first surface thereof; and a connecting part positioned on an outer side surface of the second board so as to electrically connect the first surface part and the second surface part, and the joining member includes a joining surface that joins to the external electrode, and the joining surface covers the first surface part and at least a portion of the connecting part that is closer to the first surface part than to the second surface part.

2. The module board as claimed in claim 1, wherein an external shape of the first terminal is greater than an external shape of the first surface part.

3. The module board as claimed in claim 1,
wherein the additional joining member includes a joining surface that joins to the external electrode, and the joining surface of the additional joining member covers the second surface part and at least another portion of the connecting part that is closer to the second surface part than to the first surface part.

4. The module board as claimed in claim 3, wherein an external shape of the second terminal of the connection board is greater than an external shape of the second surface part.

5. The module board as claimed in claim 1, further comprising:
a shield member shielding the first board,
wherein the shield member includes a projecting part projecting in a direction from the first surface to the second surface of the first board, and an end of the projecting part is at a position level with a position of the second surface of the first board in a direction perpendicular to the second surface of the first board, and the joining surface of the joining member further covers the end of the projecting part.

6. The module board as claimed in claim 1, wherein
the first board has a quadrilateral shape,
the second board is provided along four sides of the second surface of the first board, and
the connecting part is further provided on an inner side surface of the second board, wherein the outer side surface and the inner side surface connect the first surface and the second surface of the second board.

7. The module board as claimed in claim 6, wherein the second board includes a plurality of board parts each provided along a corresponding one of the sides of the first board.

8. The module board as claimed in claim 7, wherein the plurality of board parts is formed by cutting a single bar-shaped base material.

9. The module board as claimed in claim 1, wherein the outer side surface connects the first surface and the second surface.

* * * * *